United States Patent
Jiang et al.

(10) Patent No.: US 10,903,162 B2
(45) Date of Patent: Jan. 26, 2021

(54) FUSE ELEMENT RESISTANCE ENHANCEMENT BY LASER ANNEAL AND ION IMPLANTATION

(71) Applicant: International Business Machines Corporation, Armonk, NY (US)

(72) Inventors: Liying Jiang, Guilderland, NY (US); Juntao Li, Cohoes, NY (US); Chih-Chao Yang, Glenmont, NY (US); Michael Rizzolo, Delmar, NY (US); Yi Song, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/293,237

(22) Filed: Mar. 5, 2019

(65) Prior Publication Data
US 2020/0286827 A1 Sep. 10, 2020

(51) Int. Cl.
*H01L 21/20* (2006.01)
*H01L 23/525* (2006.01)
*H01L 21/02* (2006.01)
*H01H 69/02* (2006.01)

(52) U.S. Cl.
CPC ......... *H01L 23/5256* (2013.01); *H01H 69/02* (2013.01); *H01L 21/02354* (2013.01)

(58) Field of Classification Search
CPC ......... H01L 2924/0002; H01L 2924/00; H01L 23/5256; G11C 17/16
See application file for complete search history.

(56) References Cited

U.S. PATENT DOCUMENTS

| | | | |
|---|---|---|---|
| 4,227,168 A | 10/1980 | Knapp, Jr. | |
| 4,228,417 A | 10/1980 | Belcher | |
| 4,240,058 A | 12/1980 | Kozacka et al. | |
| 4,252,208 A | 2/1981 | Heidemeyer et al. | |
| 4,254,394 A | 3/1981 | Kozacka et al. | |
| 4,272,752 A | 6/1981 | Jacobs, Jr. | |
| 4,306,212 A | 12/1981 | Belcher | |
| 6,375,159 B2 * | 4/2002 | Daubenspeck | H01L 23/5258 257/529 |

(Continued)

OTHER PUBLICATIONS

H. Takaoka et al., "A Novel Via-Fuse Technology Featuring Highly Stable Blow Operation with Large On-Off Ratio for 32nm Node and Beyond," IEEE International Electron Devices Meeting, Dec. 10-12, 2017, pp. 43-46.

(Continued)

*Primary Examiner* — Meiya Li
(74) *Attorney, Agent, or Firm* — James Nock; Ryan, Mason & Lewis, LLP

(57) ABSTRACT

A method for fabricating an electronic fuse includes forming a recess within a film material to define opposed contact segments and a central fuse segment interconnecting the contact segments and altering the material of the central fuse segment of the film material to increase electrical resistance characteristics of the central fuse segment. The central fuse segment may include defects such as voids created by directing a laser at the central fuse segment as a component of a laser annealing process. Alternatively, and or additionally, the central fuse segment may include dopants implementing via an ion implantation process to increase resistance characteristics of the central fuse segment.

9 Claims, 7 Drawing Sheets

(56) References Cited

U.S. PATENT DOCUMENTS

| | | |
|---|---|---|
| 6,754,135 B2 | 6/2004 | Pilo |
| 6,897,543 B1 | 5/2005 | Huang et al. |
| 6,998,865 B2 | 2/2006 | Bard et al. |
| 7,157,782 B1 | 1/2007 | Shih et al. |
| 7,272,067 B1 | 9/2007 | Huang et al. |
| 8,053,863 B2 | 11/2011 | Takewaki |
| 8,829,645 B2 | 9/2014 | Kim et al. |
| 8,896,090 B2 | 11/2014 | Hogle et al. |
| 9,412,658 B2 | 8/2016 | Gluschenkov et al. |
| 9,893,012 B2 | 2/2018 | Edelstein et al. |
| 9,905,511 B2 | 2/2018 | Zhang et al. |
| 2009/0206978 A1* | 8/2009 | Hwang .................. G11C 17/16 337/295 |
| 2013/0084689 A1 | 4/2013 | Arriagada et al. |

OTHER PUBLICATIONS

R.F. Rizzolo et al., "IBM System z9 eFUSE Applications and Methodology," IBM Journal of Research and Development, Jan./Mar. 2007, pp. 65-75, vol. 51, No. 1/2.

C. Kothandaraman et al., "Electrically Programmable Fuse (eFUSE) Using Electromigration in Silicides," IEEE Electron Device Letters, Sep. 2002, pp. 523-525, vol. 23, No. 9.

M. Kaschke et al., "Rubrene, a Saturable Absorber for 308 nm," Optics Communications, May 1, 1988, pp. 211-215, vol. 66, No. 4.

\* cited by examiner

FUSE ELEMENT RESISTANCE ENHANCEMENT BY LASER ANNEAL AND ION IMPLANTATION

BACKGROUND

The present disclosure relates to semiconductor fabrication techniques and, in particular, to a method and structure to create advanced electronic fuse elements for use in semiconductor devices or integrated circuits.

A fuse is an electrical device which has a low resistance conductive path that is designed to be broken when an electrical current through the low resistance conductive path exceeds a specified limit. Electrical fuses, also referred to as e-fuses, are utilized in semiconductor integrated circuits for various applications including, for example, enabling redundant circuitry, programming one-time programmable read-only memory (PROM), configuring programmable logic devices (PLDs), trimming elements in analog trimming circuitry, implementing chip identification circuitry, etc. The e-fuses provide flexibility in semiconductor design by providing dynamic real-time programming and alteration of the functioning of the semiconductor device during operation.

The dimensions of e-fuses in semiconductor circuitry are limited by the allowable photolithographic minimal dimensions. Since the footprint area occupied by e-fuse devices is continually being reduced, power consumption of fuse devices should also be minimized.

SUMMARY

In one illustrative embodiment of the present invention, a method for fabricating an electronic fuse comprises forming a recess within a film material to define opposed contact segments and a central fuse segment interconnecting the contact segments and altering the material of the central fuse segment of the film material to increase electrical resistance characteristics of the central fuse segment.

In another illustrative embodiment of the present invention, an electronic fuse comprises a fuse member defining a central fuse segment extending between opposed contact segments and a plurality of voids defined in the central fuse segment configured to increase resistance density of the central fuse segment.

In another illustrative embodiment of the present invention, an electronic fuse includes a fuse member defining a central fuse segment extending between opposed contact segments and a plurality of dopants deposited in the central fuse segment configured to increase resistance density of the central fuse segment.

Other embodiments will be described in the following detailed description of embodiments, which is to be read in conjunction with the accompanying figures.

DETAILED DESCRIPTION

It is to be understood that embodiments discussed herein are not limited to the particular materials, features, and processing steps shown and described herein. In particular, with respect to fabrication (forming or processing) steps, it is to be emphasized that the descriptions provided herein are not necessarily intended to encompass all of the steps or components that may be used to form an electronic fuse within an integrated circuit or a semiconductor device. Rather, certain steps that are commonly used in fabricating such devices may not be described herein for economy of description.

Figure 1:
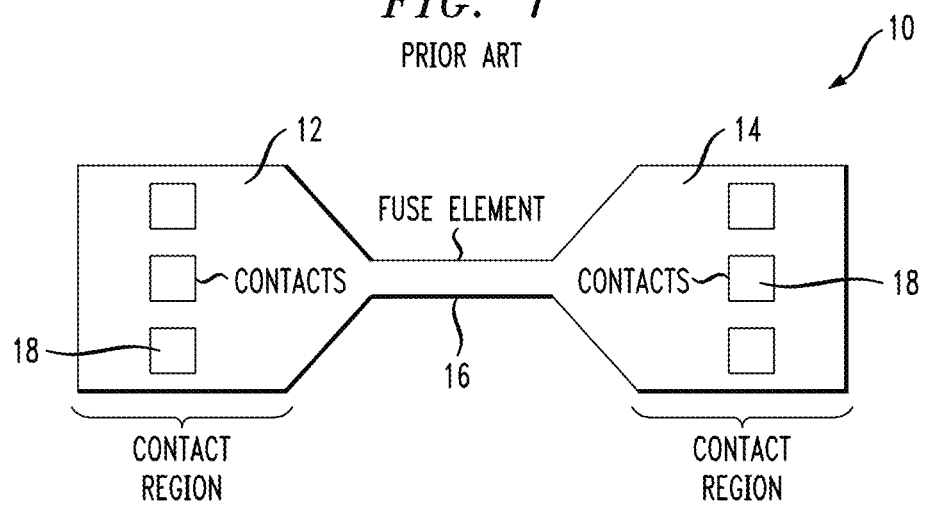
FIG. 1 is a top plan view of a prior art e-fuse illustrating a dog-bone fuse element.

FIG. 1 illustrates a conventional electronic or e-fuse device adopted in the semiconductor industry and developed by International Business Machines Corporation of Armonk, N.Y. As depicted in the plan view of FIG. 1, the e-fuse is a two-dimensional "dog-bone" shaped device utilizing in-plane dimensional differences to locate an open circuit site via a localized high electron/current flow. The e-fuse 10 includes a cathode pad 12, an anode pad 14 and a central fuse segment 16 interconnecting the cathode and anode pads 12, 14. The cathode and anode pads 12, 14 may have contacts 18. The central fuse segment 16 has a reduced cross-section relative to the cathode and anode pads 12, 14. The reduced cross-sectional area of the central fuse segment 16 increases local current density in the central fuse segment 16 where the circuit open is created. The cathode and anode pads 12, 14 may be symmetric, or alternatively, asymmetric where the cathode pad 12 is larger than the anode pad 14. When the cathode and anode pads 12, 14 are asymmetric with the cathode pad 12 being larger than the anode pad 14, reliability of the fuse programming process may be improved. The combination of high current density with the elevated temperature at the central fuse segment 16 facilitates electromigration of the conductive material. Electrically "separable" fuses utilize the electromigration (EM) effect to open an electrical connection.

The e-fuse 10 is programmed through the electromigration of the metal or metal alloy which is generated through application of an applied electrical field and an elevated temperature on the e-fuse 10. The metal alloy is electromigrated under these conditions to increase the resistance of the e-fuse 10. The rate and degree of electromigration during programming is dependent on the temperature and current density at the electromigrated portion.

The conventional e-fuse devices like e-fuse device 10 may be prone to undesirable electromigration effects which can occur in the region of the cathode pad 12 due to excessive heat buildup at the juncture of the cathode pad 12 and the central fuse segment 16. This migration results in an increase in the energy required to program the e-fuse, due in part, to the consumption of energy resulting from the cathode electromigration. This undesirably limits scaling of the e-fuse to a lower programming energy. Moreover, existing e-fuses like the e-fuse device 10 require voltages which exceed conventional voltage programming requirements. Utilizing high voltages for programming an e-fuse tests the electrical operating limits of the technology, and increases circuitry issues and complexity.

Although the aforedescribed e-fuse device 10 alleviates some of the problems of scaling, size and programming energy requirements, there is still a need for further improvements, particularly, with respect to increasing the local resistance density within the central fuse segment to thereby provide improved process control and programming efficiency including, for example, minimizing programming power or voltage requirements.

Accordingly, in accordance with illustrative embodiments of the present invention, an electronic fuse for use with a semiconductor and/or an integrated circuit is described. The electronic fuse of the present invention overcomes the drawbacks of the prior art by providing a metallic fuse with enhanced electrical resistance and substantially reduced programming requirements. In illustrative embodiments, the central fuse segment of the electronic fuse includes irregularities, impurities and/or dopants implanted during manufacture of the electronic fuse through precise controlled processing techniques. In illustrative embodiments, the irregularities are in the form of voids distributed throughout the volume of the central fuse segment. The voids are created through a laser annealing process which is controlled to direct laser energy to impinge on the central fuse segment at defined energy levels while ensuring the remaining functional components of the electronic fuse remain unaffected by the laser energy. The void density within the central fuse segment is selected to achieve desired resistance levels commensurate with current scaled back programming power requirements. In other illustrative embodiments, the central fuse segment is bombarded with ions or dopants via a charged ion implantation process. The dopant or ion concentration in the central fuse segment determines the resistance of the electronic fuse. The charged ions also produce scattering centers in the central fuse segment and accompanying irregularities, voids, etc., within the central fuse segment also increasing the resistance of the electronic fuse.

Figure 2:
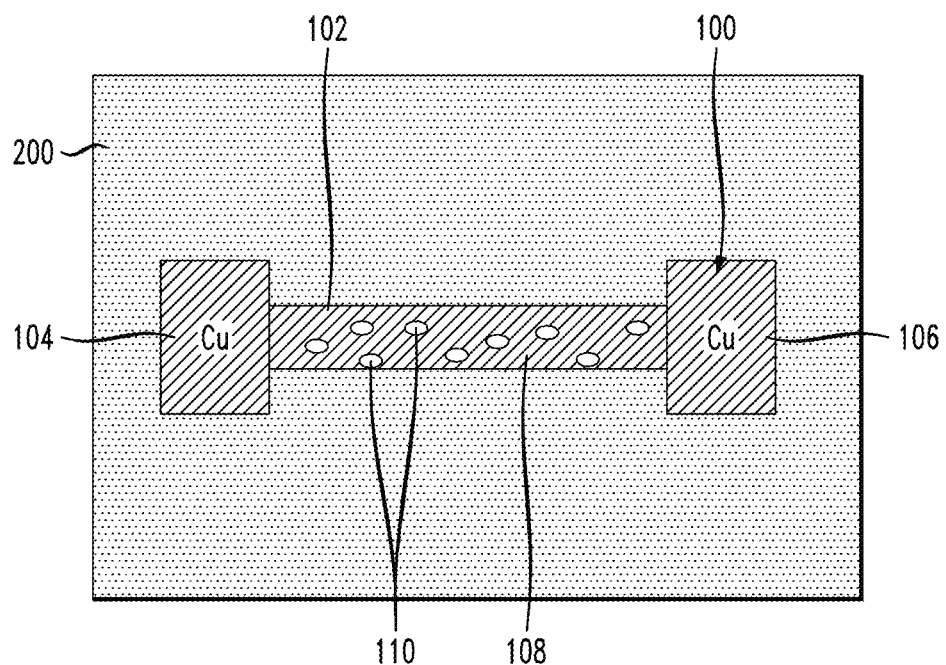
FIG. 2 is an exemplary electronic fuse mounted to a substrate according to one or more embodiments of the present invention.

Referring now to FIG. 2, one exemplary embodiment of an electronic fuse 100 according to one or more embodiments of the present invention is illustrated. The electronic fuse 100 is depicted mounted to a substrate 200 which may be a semiconductor substrate with one or more dielectric layers produced during manufacture of a semiconductor, and having circuitry embedded therein. The substrate 200 may be formed of any suitable semiconductor structure, including a bulk semiconductor, a semiconductor-on-insulator (SOI) substrate, etc. The substrate 200 may be formed of various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The electronic fuse 100 may be manufactured on the substrate 200. The electronic fuse 100 is similar to the "dog-bone" e-fuse of the prior art but includes various features and modifications which improve its functioning and resistance density. The electronic fuse is formed of a metallic material with a high laser absorption coefficient such as copper or alloys thereof. The electronic fuse 100 includes a fuse element 102 having opposed contact segments 104, 106, for example, a cathode contact and an anode contact, respectively, and a central fuse segment 108 interconnecting the contact segments 104, 106. The contact segments 104, 106 are depicted as being rectangular in plan view, but the contact segments 104, 106 may be circular, oval, define a dog-bone shape, H-shape or any other configuration. The contact segment 104 serving as the cathode contact may be larger in dimension than the contact segment 106 serving as the anode segment 106. The contact segments 104, 106 may include the contacts 18 disclosed in connection with the prior art device of FIG. 1.

The central fuse segment 108 of the electronic fuse 10 incorporates a plurality of defects, irregularities, interstitials, recesses, voids, etc., collectively referred to as voids 110, produced during manufacture of the electronic fuse 100 through application of a laser annealing process. The voids 110 may be on the exterior surface of the central fuse segment 108 and/or may be disposed within the interior of the central fuse segment 108. Moreover, through masking and control of the laser annealing process, the voids 110 are disposed in the interior volume of the central fuse segment 108. The presence of the interstitials or voids 110 substantially increases the resistance density of the central fuse segment 108, which provides significant advantages in lowering power consumption, for example, voltage requirements, needed to program the electronic fuse 10. The voids 110 increase the electrical resistance of the central fuse segment 108 through removal of conductive material through which the current may flow through the central fuse segment 108. The size of the voids 110 may vary throughout the central fuse segment 108 and the void density, i.e., the concentration of voids 110 within a specific volumetric area within the central fuse segment 108, also may vary.

The electronic fuse 100 may range in length from about 5 nanometers (nm) to about 100 nanometers (nm), and in embodiments, between about 30 to about 50 nanometers (nm).

Figure 3:
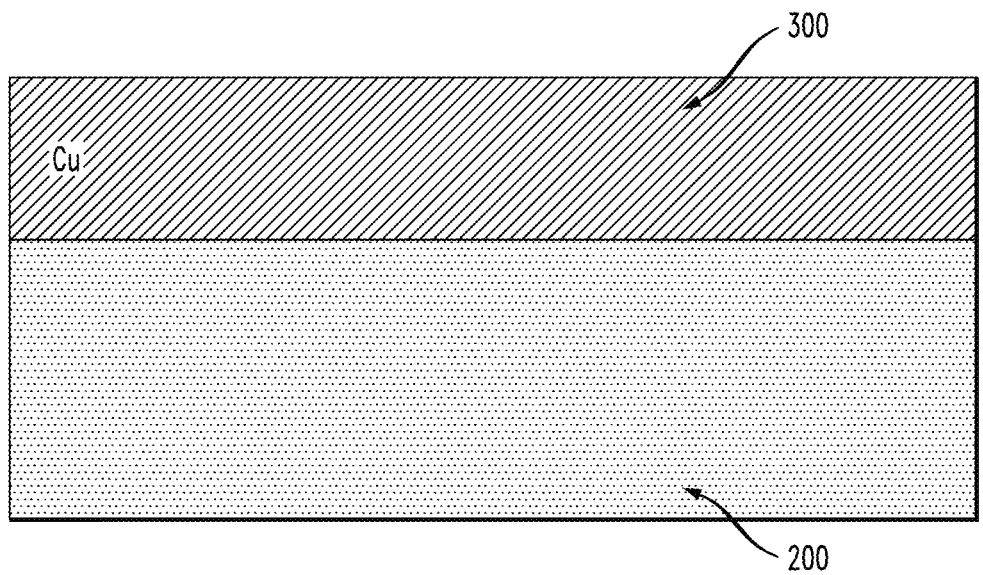
FIG. 3 is a schematic view of a metallic plate deposited on a substrate in an accordance with an exemplary methodology utilizing a laser annealing process for forming the electronic fuse of FIG. 2 according to one or more embodiments of the present invention.

FIGS. 3-6 illustrate one exemplary methodology for producing the electronic fuse 100 of FIG. 2. A metallic plate or film 300 fabricated from, for example, copper is disposed on the substrate 200 via a conventional deposition process including, for example, chemical vapor deposition (CVD), plasma enhanced chemical vapor deposition (PECVD), physical vapor deposition (PVD), sputtering, plating, chemical solution deposition, electroless plating, or combinations thereof. (FIG. 3). Although copper is used as the metallic plate, other suitable materials such as zinc, silver, aluminum, or alloys thereof are also envisioned.

Figure 4:
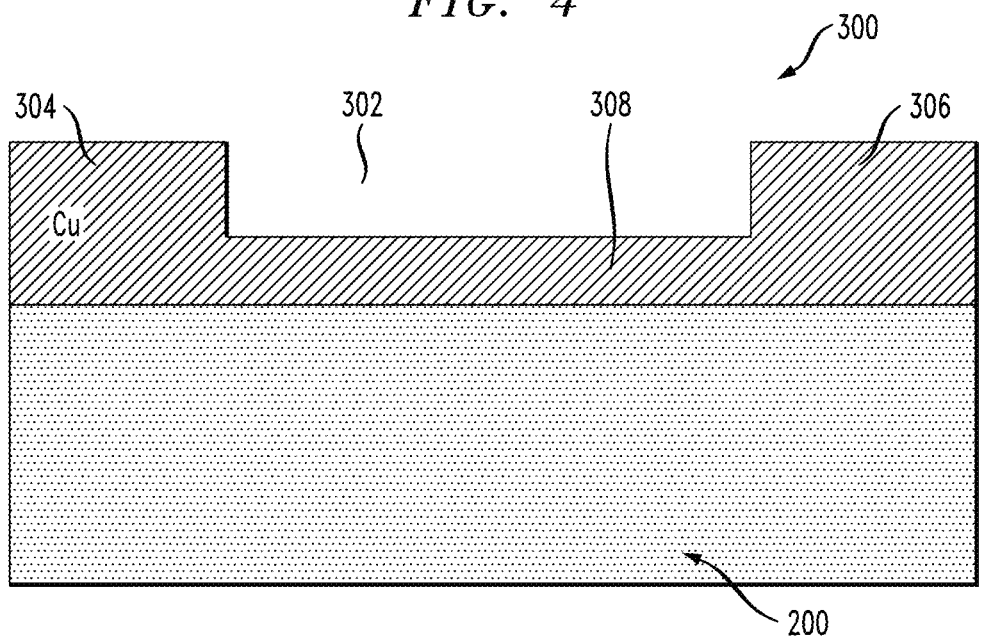
FIG. 4 is a schematic view illustrating a recess formed in the metallic plate in accordance with the exemplary methodology utilizing the laser annealing process for forming the electronic fuse of FIG. 2 according to one or more embodiments of the present invention.

A recess 302 is formed in the metallic copper film 300 through, for example, a conventional etching process, to form the general shape of the electronic fuse 100 inclusive of the contact portions 304, 306 and the central fuse segment 308 as depicted in FIG. 4. The etching process may include a dry etching process (such as, for example, reactive ion etching, ion beam etching, plasma etching or laser ablation), and/or a wet chemical etching process. The etching process is controlled whereby the height and width of the central fuse segment 308 is substantially less than the corresponding heights and widths of the contact portions 304, 306. In one exemplary embodiment, the thickness of the central fuse segment 308 is sufficient to accommodate the depth of the laser charge such that the voids may be made throughout the interior of the central fuse segment 308.

Figure 5:
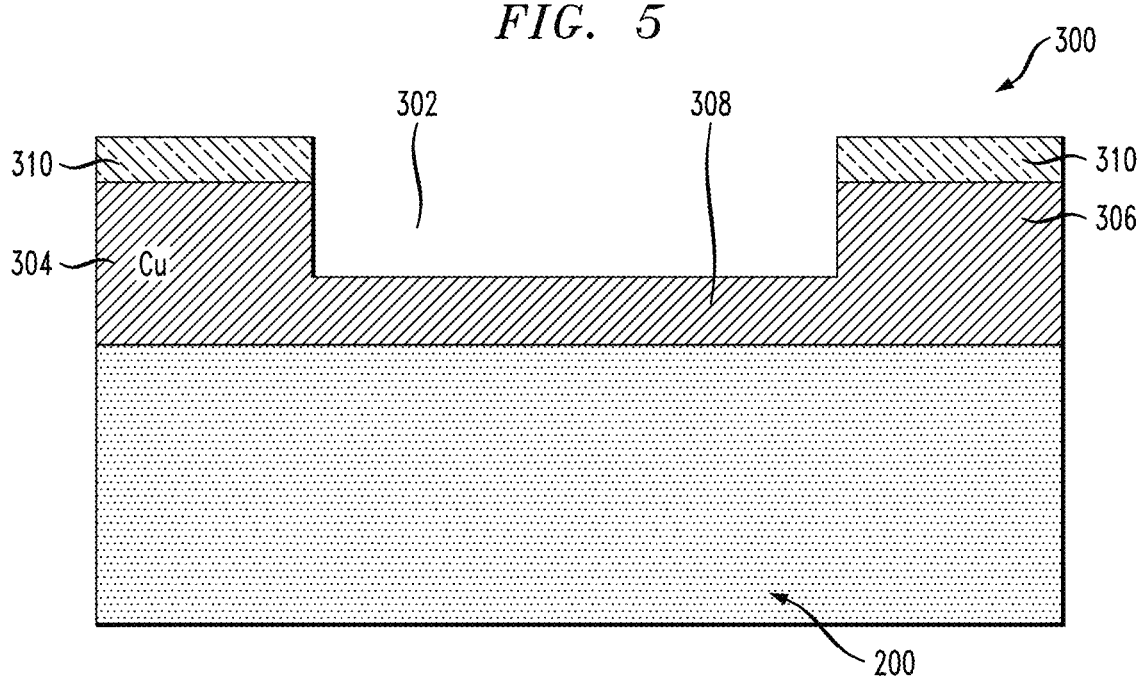
FIG. 5 is a schematic view illustrating a laser absorbing mask deposited on the contact segments of the metallic plate in accordance with the exemplary methodology utilizing the laser annealing process for forming the electronic fuse of FIG. 2 according to one or more embodiments of the present invention.

Thereafter, a laser light absorbing material 310 as a masking material is deposited on the contact portions 304, 306 as shown in FIG. 5. The light absorbing material or mask 310 may be configured to expose only a desired section of the central fuse segment 308, preferably as low as within a nanometer scale. One suitable laser light absorbing material is Rubrene having a thickness of approximately 1 micron although other thicknesses and materials are also envisioned. Rubrene has relatively high saturable absorption qualities particularly at the wavelength utilized in the exemplary laser annealing process. The masks 10 may be as thick as 1 um (micrometer) or possibly thicker to protect the contact portions 304, 306 during the laser annealing process.

Figure 6:
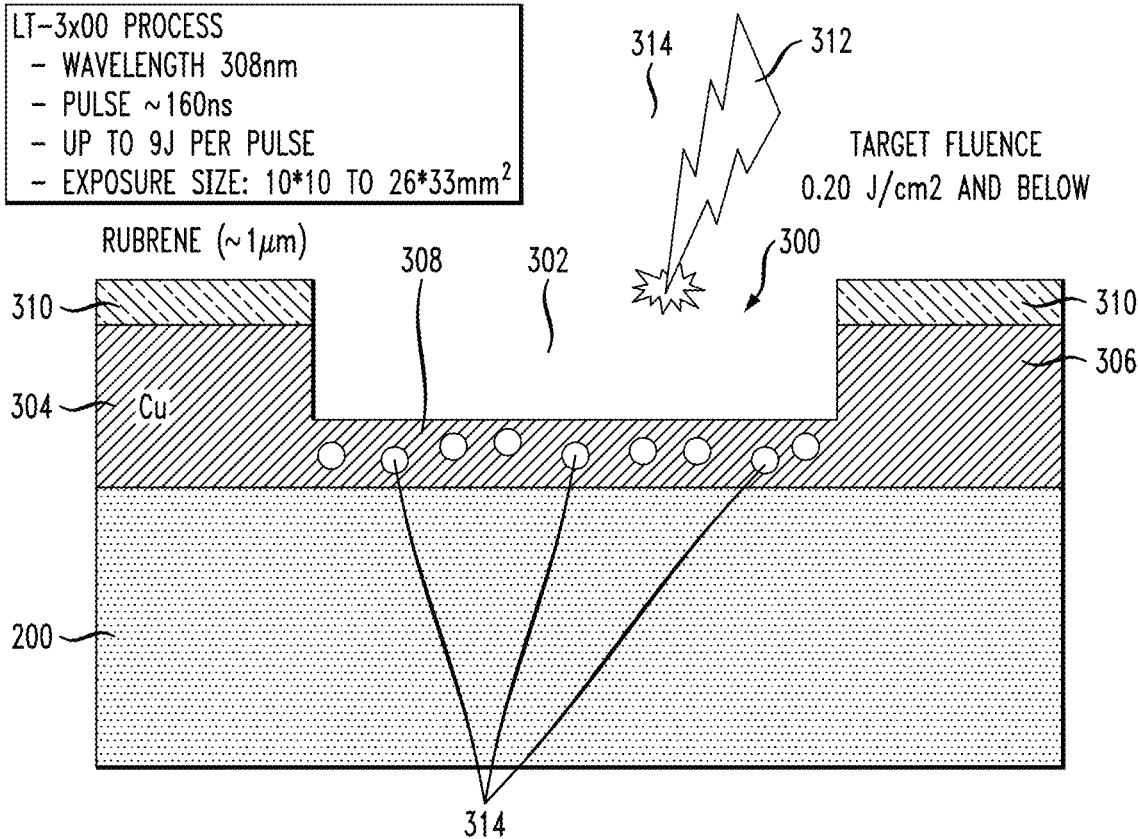
FIG. 6 is a schematic view illustrating the central fuse segment of the metallic plate subjected to a laser in accordance with the exemplary methodology utilizing the laser annealing process for forming the electronic fuse of FIG. 2 according to one or more embodiments of the present invention.

Referring now to FIG. 6, the central fuse segment 308 is subjected to a laser annealing process, represented schematically as reference numeral 312, which may be any suitable semiconductor laser incorporating at least one laser 314, for example, an excimer laser or the like. The operating parameters of the laser annealing process 312 may vary. In one exemplary embodiment, the laser annealing process 312 includes directing up to 9 joules of energy, at a wavelength of about 308 nm, a pulse of about 160 ns and a target fluence of 0.20 J/cm$^2$. The exposure size is about 10*10 millimeter (mm$^2$) to about 26*33 millimeter (mm$^2$). Other parameters are also envisioned. As a result of the laser annealing process 312, irregularities including voids 314 are formed in the outer surface and in the interior of the central fuse segment 308. The penetration depth of the laser is limited by the absorption ability of the copper central fuse segment 308. If the central fuse segment 308 is sufficiently thick, the voids 314 are generated only within the central fuse segment 308 without affecting the integrity of the contact portions 304, 306. During the laser annealing process, the contact portions 304, 306 are protected by the high saturable absorption qualities of the masks 310. Moreover, the masks 310 are sacrificial layers absorbing any laser energy directed toward the contact portions 304, 306. Upon completion of the laser annealing process, the light absorbing material or masks 310 are removed via, for example, wet or dry etching or chemical mechanical polishing (CMP) processes. The laser annealing process and the irregularities, interstitials and voids 314 generated thereby increase the resistance of the central fuse segment 308.

Figure 7:
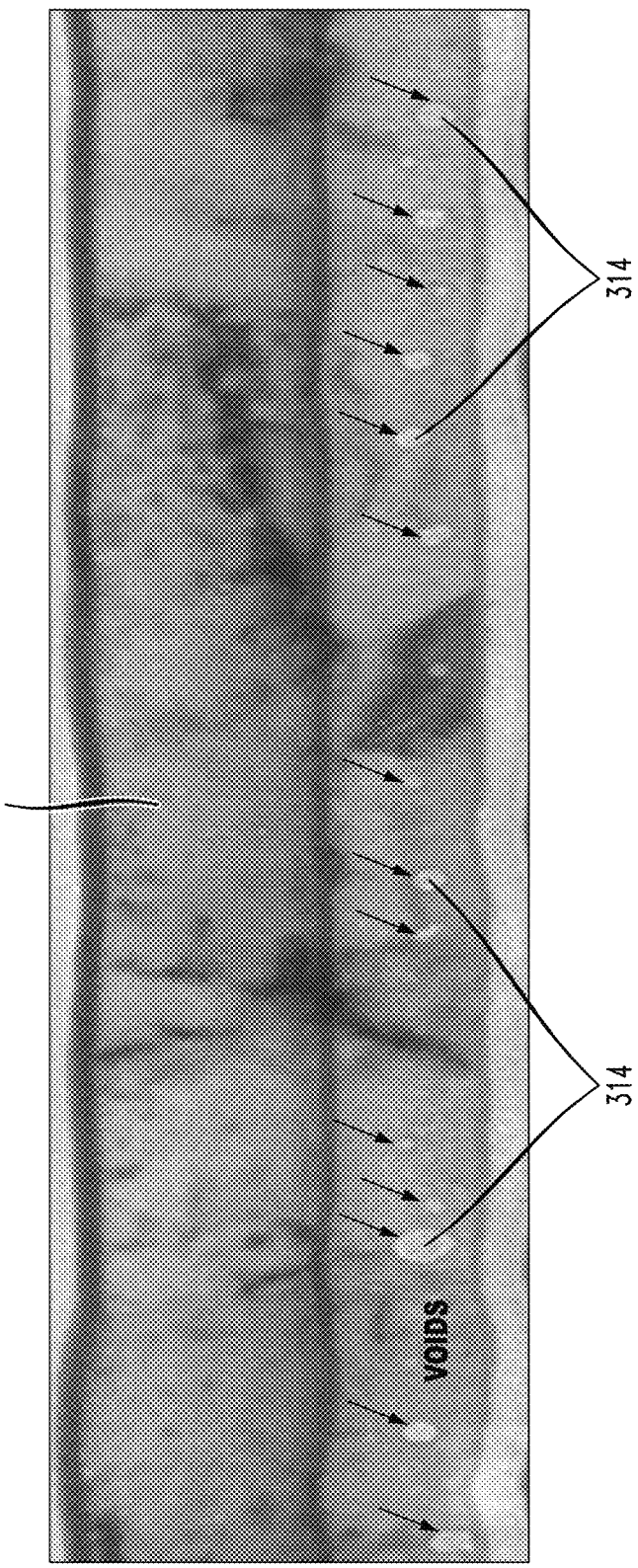
FIG. 7 is a photomicrograph of the central fuse segment of the electronic fuse when subjected to the laser annealing process illustrating the voids or interstitials within the central fuse segment according to one or more embodiments of the present invention.

FIG. 7 is a microphotograph of at least the central fuse segment 308 of the electronic fuse 100. In the microphotograph, the voids or interstitials 314 created by the laser annealing process within the central fuse segment 308 are visible. The electrical resistance of the central fuse segment 308 may be determined by the void size with larger voids providing increased resistance. The electrical resistance may also be determined by the void density. The number of voids 308 and the size of the voids 308 may be controlled through increasing/decreasing the number of applications of the laser annealing process and/or increasing/decreasing the duration times of the annealing processes. The void size may range between about 1 or 2 nanometer (nm) to 100 nanometers (nm). The void density may range from about 100 um$^{-2}$ to about 1000 um$^{-2}$. The defect density which includes various types of such as impurity, grain boundary defect, voids, etc. may be as high as 1000 um$^{-2}$.

Figure 8:
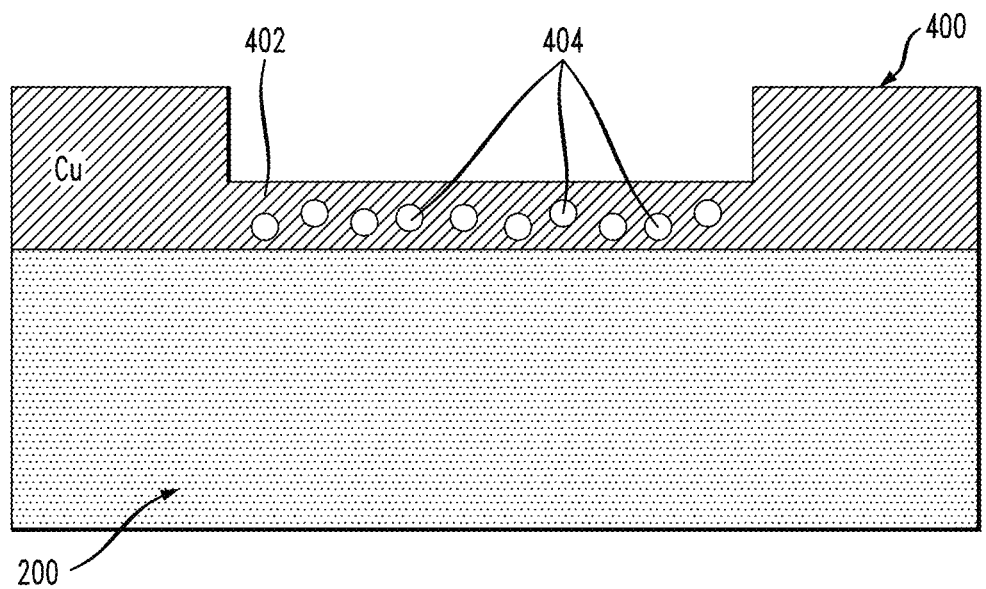
FIG. 8 is another exemplary embodiment of an electronic fuse mounted to a substrate according to one or more embodiments of the present invention.

Referring now to FIG. 8, there is illustrated another exemplary embodiment of the present invention. The electronic fuse 400 is substantially similar to the electronic fuse 100 depicted in the embodiment of FIG. 1. In accordance with this exemplary embodiment, the central fuse segment 402 is subjected to an ion implantation process to inject dopants or "impurities" 404 directly within the metallic central fuse segment 402 of the electronic fuse 400. The presence of the impurities 404 increases the resistance density of the central fuse segment 402. Moreover, the dopant or ion concentration in the central fuse segment 402 and the scattering centers generated thereby determines the resistance of the electronic fuse 400. The scattering centers induce the formation of interstitials, vacancies, impurities, precipitates, grain boundaries and other defects within the central fuse segment 402.

Figure 9:
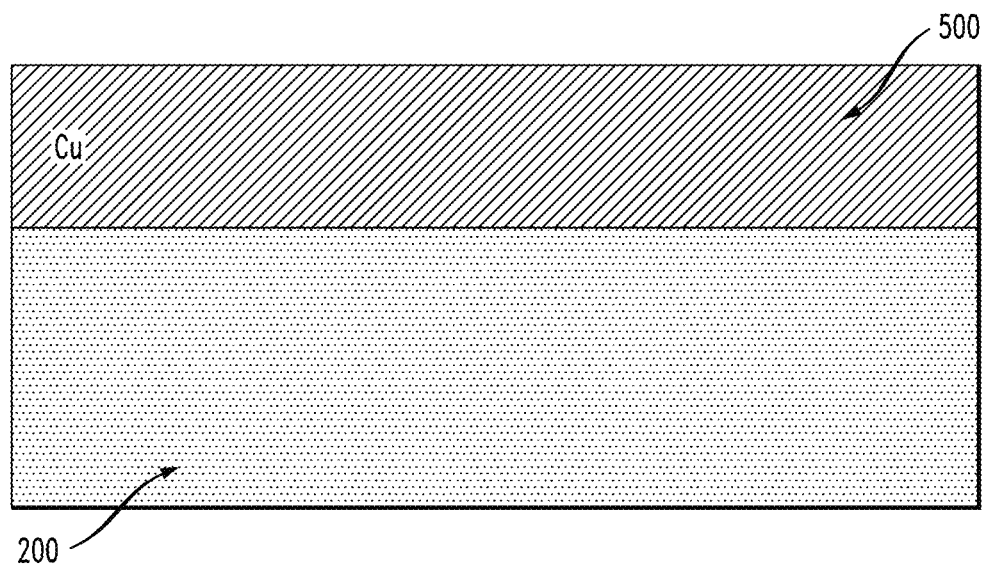
FIG. 9 is a schematic view of a metallic plate deposited on a substrate in an accordance with an exemplary methodology utilizing an ion implantation process for forming the electronic fuse of FIG. 8 according to one or more embodiments of the present invention.
Figure 10:
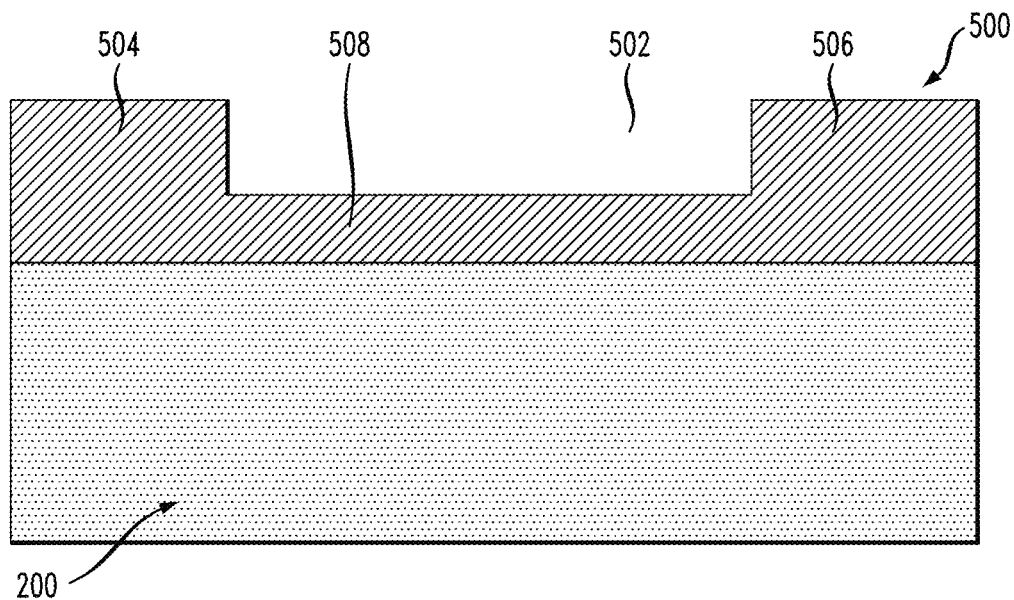
FIG. 10 is a schematic view illustrating a recess formed in the metallic plate in accordance with the exemplary methodology utilizing the ion implantation process for forming the electronic fuse of FIG. 8 according to one or more embodiments of the present invention.
Figure 11:
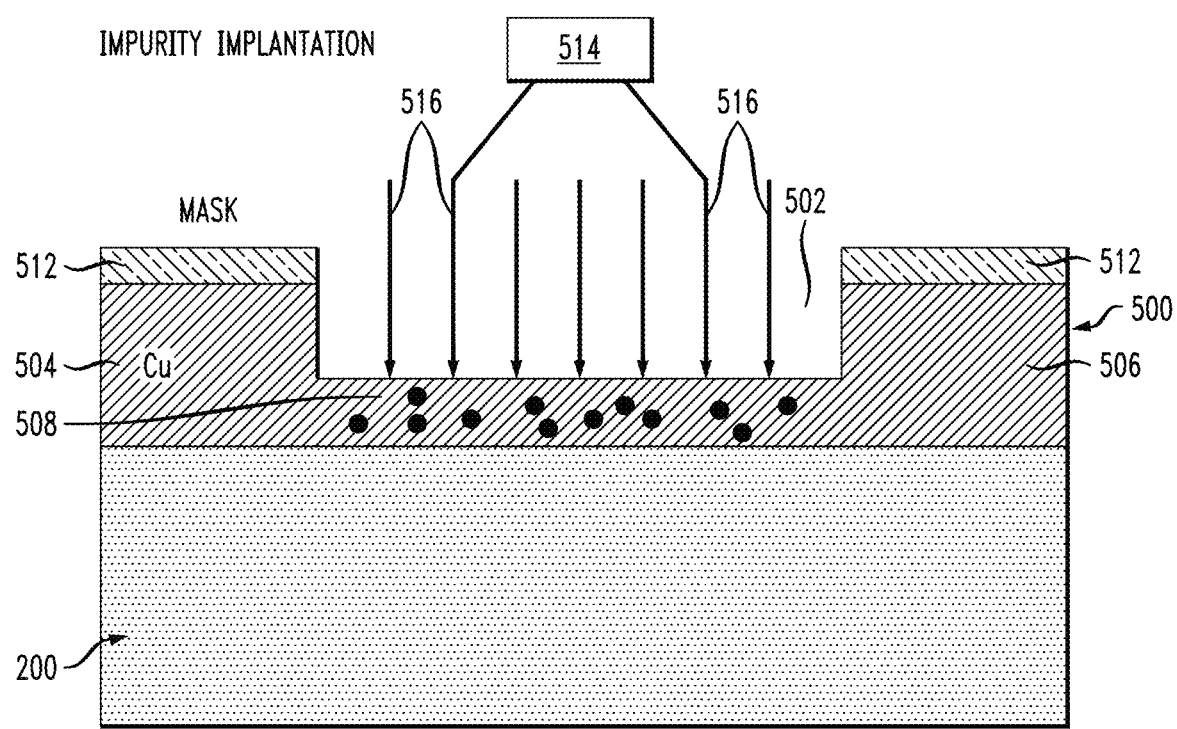
FIG. 11 is a schematic view illustrating acceleration of ions into the central fuse segment of the metallic plate in accordance with the exemplary methodology utilizing the ion implantation process for forming the electronic fuse of FIG. 8 according to one or more embodiments of the present invention.

The methodology for fabricating the electronic fuse 400 of FIG. 8 is disclosed in connection with FIGS. 9-11. With reference to FIG. 9, a substrate 200 is provided similar to the substrate 200 of FIG. 2 and a metallic film or plate 500 is deposited on the substrate 200 through the afore-described conventional deposition methodologies. The metallic film 500 may be fabricated from copper or any of the other mentioned materials. A recess 502 is etched into the metallic film 500 also in the manner discussed hereinabove to define the contact portions 504, 506 and the central fuse segment 508 as depicted in FIG. 10.

With reference to FIG. 11, a mask material 512 is placed over each contact portion 504, 506. Any mask or photoresist material suitable to resist penetration of ions during an ion implantation process may be utilized. With the contact portions 504, 506 protected by the mask material 512, the central fuse segment 508 is subjected to the ion implantation process via an ion implantation system, identified schematically as reference numeral 514. The system 514 accelerates dopants or ions, identified schematically by arrows 516, within the material of the central fuse segment 508 to enhance the resistive characteristics of the material of the central fuse segment 508. The system 514 may be any commercially available system including an ion source and an accelerator. The depth of the ion implantation may be controlled and the concentration of the ions or dopants is maximized within the central fuse segment 508. The presence of the ions 516 increases the number of defects and the scattering centers in the volume of the conductive copper metal in the central fuse segment 508 thereby effectively increasing the resistance in this area as discussed hereinabove. Suitable dopants include one or more of boron (B), bismuth (Bi), phosphorous (P), nitrogen (N) or arsenic (As) ions or combinations thereof. The dopants also may induce voids within the central fuse segments 508.

The parameters of the implantation process, including ion energy and dosage, may be selected to control the concentration of dopants introduced within the central fuse segment 508 and the depth of penetration of the dopants within the volume of the central fuse segment 508. Increasing the ion density within the central fuse segment will increase the resistance of the central fuse segment. The ion density can range from $10^{15}$ cm$^{-3}$ to about as $10^{20}$ cm$^{-3}$ and is dependent on the frequency and duration of the implantation time. An increased ion density will increase the resistance of the central fuse segment 508. The final resistance of the electronic fuse 400 can be adjusted. For instance, if the resistance measurement after the first irradiation shows that the resistance is not yet high enough, then the resistance can be easily adjusted by means of re-irradiation to provide the benefits described hereinabove.

Figure 12:
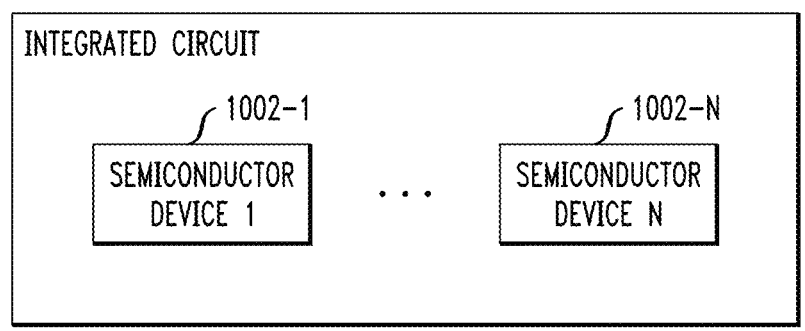
FIG. 12 depicts a block diagram of an integrated circuit with a plurality of semiconductor devices incorporating the electronic fuse formed according to one or more embodiments of the present invention.

It is envisioned that the substrates 200 upon which the presently-disclosed electronic fuses are mounted may be a component of a semiconductor and also a component of an integrated circuit. For example, FIG. 12 depicts an integrated circuit 1000 with a plurality of semiconductor devices 1002-1 through 1002-N incorporating the electronic fuses 100, 400 formed according to one or more illustrative embodiments. It is to be appreciated that at least two of the semiconductor devices 1002-1 through 1002-N comprise semiconductor structures having the electronic fuses 100, 400 formed in accordance with the illustrative methodologies discussed hereinabove.

The resulting integrated circuit incorporating the electronic fuses 100, 400 can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuits, ranging from toys and other low-end applications to advanced computer products having a display, a keyboard or other input device, and a central processor.

It is to be understood that the embodiments discussed herein are not limited to the particular materials, features, and processing steps shown and described herein. In particular, with respect to the processing steps, it is to be emphasized that the descriptions provided herein are not intended to encompass all of the processing steps that may be required to form a functional semiconductor integrated circuit device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. For example, it is envisioned that the central fuse segment may be subjected both to the laser annealing process and the ion implantation process. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating an electronic fuse, comprising:
    forming a recess within a film material to define opposed contact segments and a central fuse segment interconnecting the opposed contact segments; and
    altering material of the central fuse segment of the film material to increase electrical resistance characteristics of the central fuse segment.

2. The method of claim 1, wherein the film material is copper.

3. The method of claim 2, wherein forming the recess in the film material includes etching the film material.

4. The method of claim 3, wherein altering the material of the central fuse segment includes creating voids within the central fuse segment by directing a laser at the central fuse segment as a component of a laser annealing process.

5. The method of claim 4, further including applying a masking material to the contact segments prior to directing the laser.

6. The method of claim 5, wherein the masking material includes a laser absorbing material.

7. The method of claim 6, wherein the masking material is Rubrene.

8. The method of claim 6, further including removing the masking material.

9. The method of claim 6, further including removing the masking material by an etching or chemical mechanical polishing process.

* * * * *